United States Patent [19]

Spanjer

[11] 4,096,521
[45] Jun. 20, 1978

[54] PROTECTIVE COATING FOR HIGH VOLTAGE DEVICES

[75] Inventor: Keith Gordon Spanjer, Scottsdale, Ariz.

[73] Assignee: Motorola Inc., Schaumburg, Ill.

[21] Appl. No.: 703,487

[22] Filed: Jul. 8, 1976

[51] Int. Cl.² .............................................. H01L 23/30
[52] U.S. Cl. .......................................... 357/54; 357/72
[58] Field of Search ............................ 357/52, 54, 72; 174/52 PE; 260/37 M

[56] References Cited

U.S. PATENT DOCUMENTS

| 3,584,264 | 6/1971 | McLouski et al. ............... 357/54 |
| 3,597,269 | 8/1971 | Chang et al. .................... 357/54 |
| 3,916,073 | 10/1975 | Horowitz et al. ............... 357/52 X |
| 3,939,488 | 2/1976 | Wakashima et al. ............ 357/72 |
| 4,024,318 | 5/1977 | Forster et al. ................ 260/37 M X |

FOREIGN PATENT DOCUMENTS

| 2,086,644 | 12/1971 | France ........................... 260/37 M |

*Primary Examiner*—Stanley D. Miller, Jr.
*Assistant Examiner*—James W. Davie
*Attorney, Agent, or Firm*—Robert D. Lott; Kenneth R. Stevens

[57] ABSTRACT

A thermally stable encapsulant for a semiconductor substrate having high voltage devices disposed therein including a coating comprising a polymer having suitable polar characteristics and a metal oxide for depleting excess electron charge and for stablizing ionic contaminants during high voltage operation.

2 Claims, 1 Drawing Figure

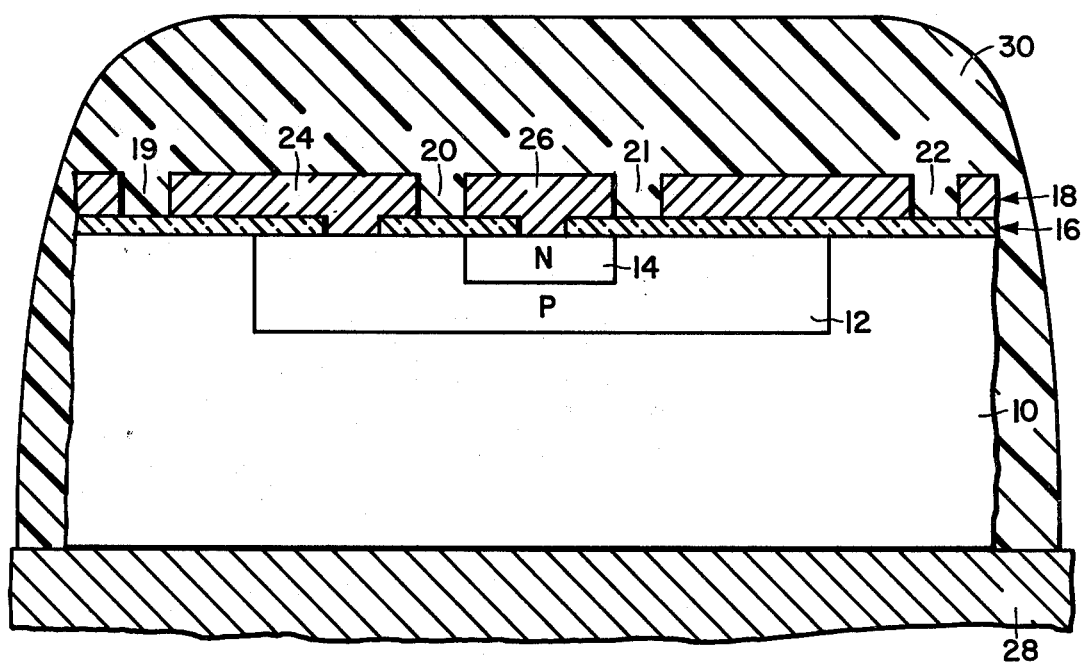

PROTECTIVE COATING FOR HIGH VOLTAGE DEVICES

BACKGROUND OF THE INVENTION

A device such as Motorola's planar NPN power transistors, identified as PLE 36 are theoretically capable of operating at a bulk breakdown voltage in excess of 1000 volts. However, in actual practice using existing processing and assembly techniques the devices are surface limited to a 500 to 600 volt maximum operating capacity.

Although not completely understood, it is theorized that a limiting factor occurs in connection with the surface inversion of the device, or the creation of charged particles in the $SiO_2$ passivation layer. For an NPN device the $SiO_2$ layer will become positively charged at high voltage operation and similarly a negative layer is created at the interface of the base junction and extending outwardly therefrom. The intensities and depths of these charged layers apparently depend upon the voltage level at which the device is being operated. It is felt that these high intensity or excess charges cause current crowding and create parasitic resistors deleteriously affecting expected high voltage operation.

Another purpose of the encapsulating layers is to prevent ambient contamination and "operational" contaminants caused by high voltage operation. Known prior art techniques employ encapsulants or die coatings comprising polymers having suitable polar characteristics combined with silicon oxide material. This approach, however, is not effective over a wide range of conditions. More specifically, this combination of materials becomes thermally unstable at higher temperatures and as a result its beneficial properties as an encapsulant are diminished.

SUMMARY OF THE INVENTION

It is therefore an object of the present invention to provide a high power device encapsulant which is effective over a wider range of temperatures than known encapsulants.

Another object of the present invention is to provide an encapsulant which allows a high power device to be operated closer to its theoretical bulk breakdown voltage.

Another object of the present invention is to provide a high power device encapsulant which is thermally stable over a wide range of temperatures and extends the bulk breakdown voltage operating range of the device without diminishing its efficacy in minimizing the undersirable effects of ambient and ionic contaminants.

BRIEF DESCRIPTION OF THE DRAWINGS

The sole FIGURE illustrates, in a partial broken away cross sectional view, a high powered NPN device being protected by the encapsulating layer of the present invention.

DESCRIPTION OF THE PREFERRED EMBODIMENTS

The sole FIGURE illustrates a high powered NPN device being formed on an N-type silicon substrate 10. A P-type region 12 constitutes the base of the NPN device and N-type region 14 forms the emitter. Disposed over the upper surface of the NPN device is an $SiO_2$ passivating layer 16 having openings formed therein. A patterned aluminum metallization layer 18 is deposited over the passivating layer 16 and appropriately etched to form openings 19, 20, 21 and 22 in order to delineate a base contact 24 and an emitter contact 26. Contact to the collector is made from the under side of the substrate or die 10 by contact 28 shown partially broken away for purposes of simplicity.

An encapsulating layer 30 is deposited over the entire substrate in order to provide protection against ambient and electrical conditions. In the preferred embodiment of the present invention the encapsulating layer 30 consists of 70 percent ferric oxide, $Fe_2O_3$, combined with 30 percent by volume of a polyimide having suitable polar characteristics. In this preferred embodiment a Rhone-Poulsenc 605 polyimide having the following chemical formulation is employed.

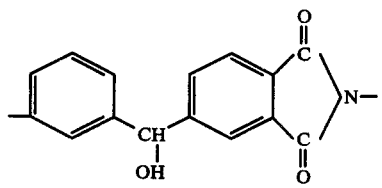

Other polyimides reasonably expected to have suitable polar characteristics for use with the present invention are commercially known as DuPont 2550 or Dow Corning 997 polyimide formulations. It is also expected that other oxides could be used such as lanthanum oxide, chrome oxide and tin oxide in place of the ferric oxide employed in the preferred embodiment.

Although not thoroughly understood, it is hypothesized that the combination of the polyimide having suitable polar characteristics, that is, the ability to be polarized when combined with the ferric oxide according to the present words, results in an improved encapsulant extending the high voltage operating range of power devices for two reasons. In the high voltage operation of the NPN device shown in the sole FIGURE a positive charge would tend to accumulate at the might 2 layer and a negative charge at the interface extending directly thereunder. Since the polyimide selected is a polarizable material it would posses a high valance of electron charge within the material itself. In addition, the ferric oxide was theorized to be a susceptor for the charged particles formed in the $SiO_2$ layer. In other woeds, the combination of the particular polymer and ferric oxide material is effective to deplete the positive charge in the $SiO_2$ layer at high voltage operation. Simultaneously, it is felt that the encapsulating layer 30 stabilizes ionic contaminants that migh be induced by electromigration. Finally, the composition of this particular encapsulant is extremely stable at higher temperatures and reliable operation of devices above 600 volts has been achieved at temperatures ranges extending between $-65°$ C to $200°$ C. Although illustrated for an NPN device the present invention is expected to be equally implementable for an PNP device.

What is claimed is:

1. An encapsulated semiconductor substrate comprising:
   (a) at least one semiconductor device disposed in said substrate;
   (b) a coating disposed over said semiconductor device; and (c) said coating comprising a polyimide of the following chemical formulation,

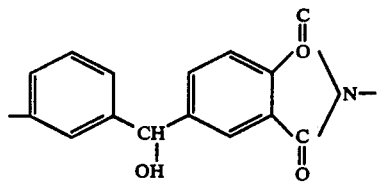

and ferric oxide for depleting excess electron charge and for stabilizing ionic contaminants during operation of said semiconductor device.

2. An encapsulated semiconductor substrate as in claim 1, wherein:
(a) said semiconductor device is an NPN transistor, and further comprising;
(b) a passivating layer disposed between said coating and said substrate, and said coating depleting excess charge from said passivating layer during operation of said NPN transistor.

* * * * *